United States Patent [19]

Onishi et al.

[11] Patent Number: 5,725,819
[45] Date of Patent: Mar. 10, 1998

[54] INJECTION MOLDING METHOD FOR BOARD FOR IC CARD

[75] Inventors: Masayoshi Onishi, Mukou; Seiji Kegai, Yamatokouriyama; Koichi Ozaki, Otokuni-Gun; Kaname Tamada, Ibaraki-Ken; Hiroyoshi Takagi, Kameoka, all of Japan

[73] Assignees: Hitachi Maxell, Ltd., Osaka-Fu; Maxell Seiki, Ltd., Kyoto-Fu, both of Japan

[21] Appl. No.: 505,447

[22] Filed: Jul. 21, 1995

[30] Foreign Application Priority Data

| Jul. 21, 1994 | [JP] | Japan | 6-192126 |
| Jul. 21, 1994 | [JP] | Japan | 6-192127 |
| May 31, 1995 | [JP] | Japan | 7-158561 |

[51] Int. Cl.⁶ ............ B29C 45/38; B29C 45/40
[52] U.S. Cl. ............ 264/161; 264/328.7; 264/334; 425/556; 425/577; 425/444
[58] Field of Search ............ 264/161, 328.7, 264/328.9, 328.11, 334, 336; 425/553, 554, 555, 556, 577, DIG. 224, 444, 438

[56] References Cited

U.S. PATENT DOCUMENTS

| 4,849,844 | 7/1989 | Kato. | |
| 4,954,308 | 9/1990 | Yabe et al.. | |
| 4,980,115 | 12/1990 | Hatakeyama et al. | 264/328.7 |
| 5,254,304 | 10/1993 | Adachi et al. | 264/334 |
| 5,340,528 | 8/1994 | Machida et al. | 264/328.7 |
| 5,405,259 | 4/1995 | Morikita | 264/334 |
| 5,419,697 | 5/1995 | Hirano et al. | 425/556 |
| 5,439,371 | 8/1995 | Sawaya | 425/553 |
| 5,472,335 | 12/1995 | Morikita | 425/556 |
| 5,476,629 | 12/1995 | Yabe et al. | 264/328.7 |
| 5,492,658 | 2/1996 | Ohno et al. | 264/161 |
| 5,512,223 | 4/1996 | Morikita | 264/161 |
| 5,520,863 | 5/1996 | Ochi et al. | 264/161 |

FOREIGN PATENT DOCUMENTS

| 56148533 | 2/1982 | European Pat. Off.. | |
| 0359632A1 | 3/1990 | European Pat. Off.. | |
| 0472768 | 3/1992 | European Pat. Off.. | |
| 0527438A2 | 2/1993 | European Pat. Off.. | |
| 2700041 | 7/1994 | France. | |
| 56-148533 | 11/1981 | Japan | 425/553 |
| 61-35923 | 2/1986 | Japan | 425/553 |
| 62-202373 | 9/1987 | Japan. | |
| 3-77333 | 4/1991 | Japan | 425/556 |

*Primary Examiner*—Jill L. Heitbrink
*Attorney, Agent, or Firm*—Birch, Stewart, Kolasch & Birch, LLP

[57] ABSTRACT

A plate for an IC card having recesses for mounting components is formed by injection molding of plastics. First, a mold for forming recesses for mounting components is formed to have a slide core. After molten resin is filled in a cavity, the slide core is forced to penetrate into the cavity. Thus, the molten resin is removed by the slide core so as to form the recesses and walls. Because the resin has been filled beforehand, even if the wall is thin, the filling process is carried out normally, and the walls can be formed without increasing an injection pressure.

19 Claims, 9 Drawing Sheets

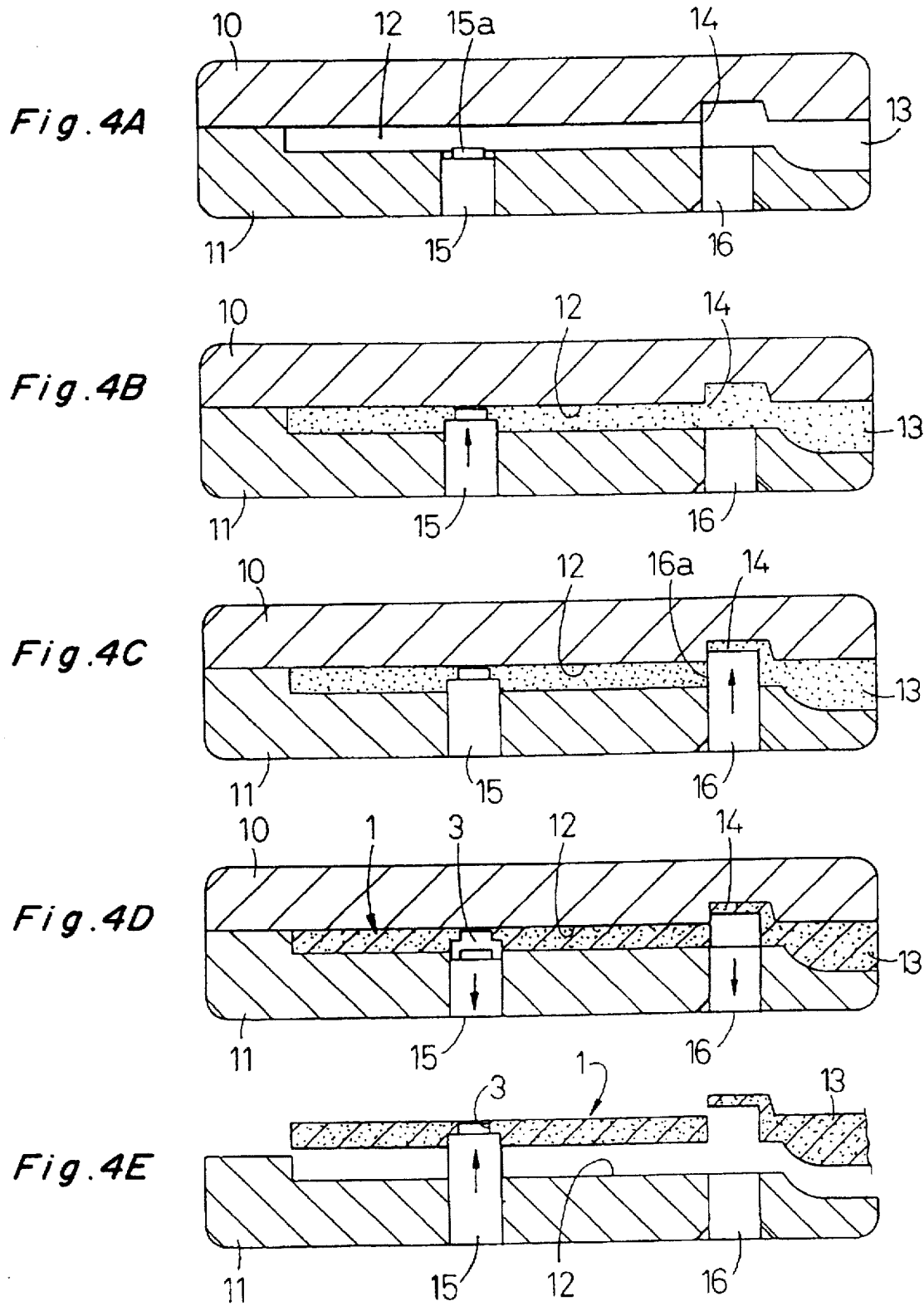

INJECTION MOLDING METHOD FOR BOARD FOR IC CARD

BACKGROUND OF THE INVENTION

1. Field of the Invention

The present invention relates to a manufacturing method of a board for an IC card for mounting an integrated circuit chip or the like, and a board manufactured by the method.

2. Description of the Prior Art

An IC (integrated circuit) card comprises a board on which electronics components such as an IC chip of a memory device or a microprocessor are mounted. A board provided for producing an IC card may have one or more recesses on a plane thereof for mounting components. A board may be produced by injection molding. For example, after the components are fixed to the recess, resin is filled into the recesses to seal the components.

Such a board is described for example in Japanese Patent laid open Publication 62-298143/1987. In the production of the board, a plastic plate of a prescribed thickness is punched with a press to produce a card blank. Then, recesses for mounting components are cut in the blank precisely by a numerical control machine, to provide the board. However, the board produced as described above has a high production cost, and it is hard to reduce the cost even by mass production.

If the board is formed with injection molding with a plastics material at the same time as the recesses for mounting the components as an integral body, the production cost can be reduced largely. However, the thickness of the board is about 0.8 mm. Therefore, if the recesses are formed at the same time, the thickness at the bottom wall of the recesses becomes very thin, or the bottom walls cannot be formed surely. Therefore, cutting is adopted at present than injection molding.

However, if cutting is adopted, when an integrated circuit chip is fitted to the recess for adhesion, a portion of the recess to be adhered has a relatively smooth surface due to precise cutting. Therefore, when an IC card is subjected to a strong shock or when a card is bent, a part of adhesion plane is liable to be separated. In order to prevent the separation, the walls may be remained to have rough surfaces to increase adhesion strength. However, in such a case, precision along depth direction is liable to have a scattering, and precision of positions of connection terminals of integrated circuit chips cannot be maintained.

SUMMARY OF THE INVENTION

An object of the present invention is to provide a manufacturing method of a board for an IC card, the board having a recess with a film-like wall at the bottom of the recess, the method being able to mass-produce the board to reduce a production a cost to a large degree.

Another object of the present invention is to provide a manufacturing method of a board for an IC card which can form a film-like wall surely without increasing injection pressure while improving mechanical strength and heat resistance.

A third object of the present invention is to provide a manufacturing method of a board for an IC card which can form the board without strain due to forming.

A fourth object of the present invention is to provide a manufacturing method of a board for an IC card which can remove a gate during the forming so that removal of the gate after separating the mold is not needed to reduce a production cost of the board.

A fifth object of the present invention is to provide a board for an IC card, the board itself or a bottom wall thereof having a sufficient mechanical strength to improve endurance.

A sixth object of the present invention is to provide a board for an IC card having no strain due to forming, no deformation due to heat and superior on heat resistance.

A seventh object of the present invention is to provide a board for an IC card wherein a component such as an IC chip can be adhered and fixed strongly to a recess so that the component is not removed when an abnormal strength of bending and shock exerts to the board or the endurance is good.

In one aspect of the invention, a board for an IC card is manufactured. The board has a recess for receiving a component such as an integrated circuit chip in one of the planes of the board, and the recess has a film-like wall integrated as one body with the board at an inner bottom of the recess. In the method, (a) a slide core is provided in a mold for injection molding for forming the board, the slide core 15 facing a cavity 12 in the mold. (b) Then, molten resin is injected into the cavity, and the slide core is moved into the cavity to a forming position before the resin began to solidify. Thus, the recess and the film-like wall can be formed at the same time surely.

In a second aspect of the invention, a board for an IC card, comprises a recess for receiving a component such as an integrated circuit chip in one of the planes of the board, the recess having a film-like wall integrated as one body with the board at an inner bottom of the recess. The board is made of a plastic material by using injection molding, and the recess and the film-like wall are made with a slide core projecting into a cavity with injected molten resin.

In a third aspect of the invention, a board for an IC card comprises a recess for receiving and adhering a component such as an integrated circuit chip in one of the planes of the board produced by injection molding, and the recess has a film-like wall integrated as one body with the board at an inner bottom of the recess. The board comprises an adhesion wall for adhering the component for fixing it, the adhesion wall having an uneven surface.

It is an advantage of the invention that a film-like wall at the bottom of the recess can be formed surely in a board for an IC card.

It is another advantage of the invention is that a board for an IC card can be mass-produced.

BRIEF DESCRIPTION OF THE DRAWINGS

These and other objects and features of the present invention will become clear from the following description taken in conjunction with the preferred embodiments thereof with reference to the accompanying drawings, and in which:

FIGS. 4A —4E are schematic sectional views of a mold for explaining steps for producing the board;

DETAILED DESCRIPTION OF THE PREFERRED EMBODIMENTS

Figure 1:
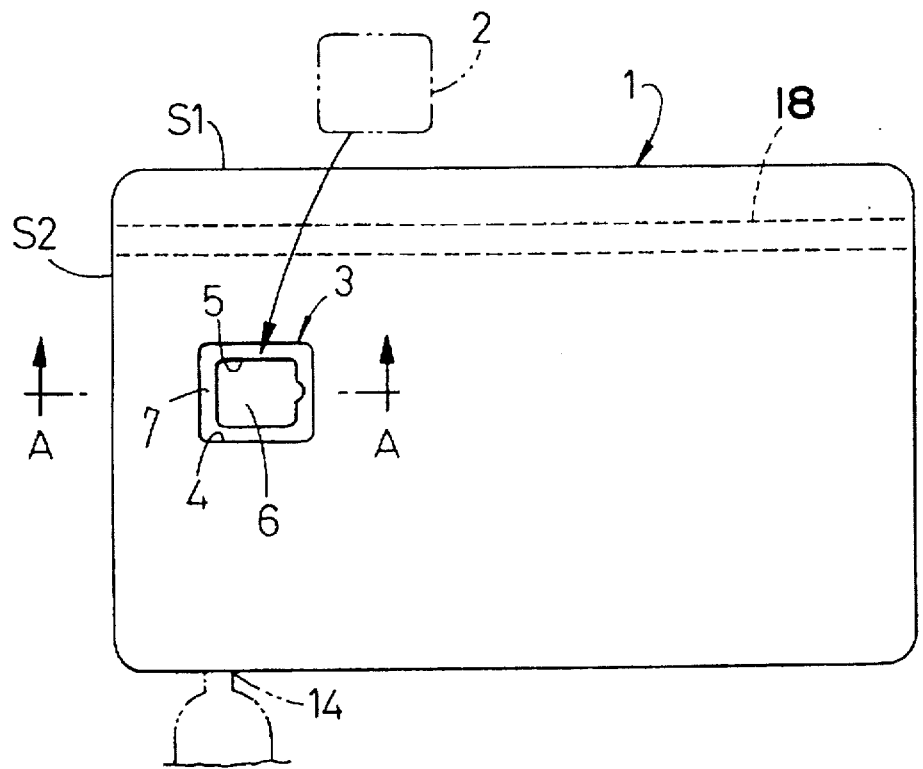
FIG. 1 is a plan view of a board of an IC card.

Referring now to the drawings, wherein like reference characters designate like or corresponding parts throughout the views, embodiments of the invention are explained. A board for an IC card has a recess for receiving a component such as an integrated circuit chip in one of the planes of the board, and the recess has a film-like wall integrated as one body with the board provided at the bottom of the recess. The board is made of a plastics material by injection molding.

In injection molding where resin is filled into a narrow cavity in a mold, it is proposed that fluidity of molten resin is improved or injection pressure is increased (refer to Japanese Patent laid open Publication 62-202373/1987). However, if this technique is applied to production of a board for an IC card, the inventors found that the bottom wall at the recesses for mounting components cannot be formed surely. If injection pressure is increased, though the bottom wall can be formed, weld lines are formed at the surfaces thereof. Such a bottom wall do not have a sufficient mechanical strength, and when an external force is applied to the bottom wall, the component mounted to the recess cannot be protected enough. Further, an increase in injection pressure also increases wear of an injection mold.

Figure 2:
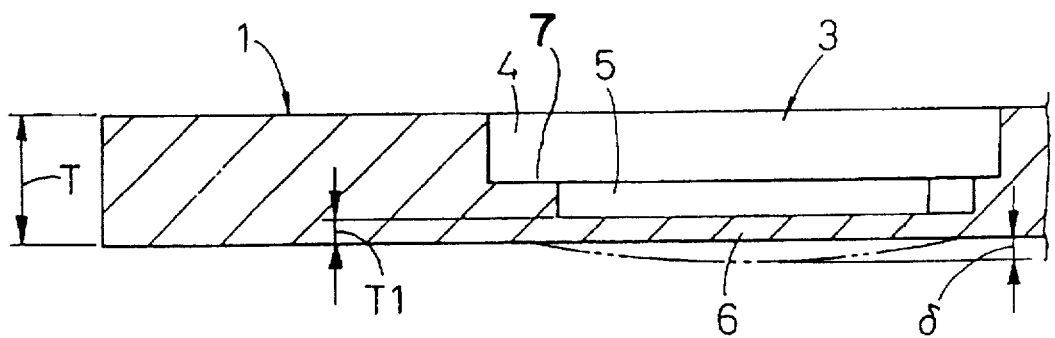
FIG. 2 is a sectional view along A—A line in FIG. 1.

FIG. 1 shows a board of an IC card schematically, and FIG. 2 is a sectional view along A—A line in FIG. 1. The board 1 has a square shape, and it has a recess 3 on a plane thereof for mounting a component 2 such as an integrated circuit chip at left or right side thereof at about the center. The recess 3 comprises a first square recess 4 for mounting a base 2a (not shown) of the component 2. Further, a second hole 5 smaller than the first one 4 is provided at the bottom of the first one 4 like a terrace structure. The inner bottom of the recess 3 or of the second hole 5 comprises a bottom wall 6 which is formed as an integral body continuous to a main body of the board 1 with injection molding using a plastics material. The bottom wall 6 is thin like a film. Further in FIGS. 2 and 6, the sizes of the recess 3 is exaggerated along vertical direction.

The board 1 has a size of a longer side of 85.6 mm, a shorter side of 54 mm and a thickness T of 0.80 mm. Longer and shorter sides of the first hole 5 are 12 mm and 10.6 mm, respectively. A thickness T1 of the bottom wall 6 is 0.22 mm. A resin material for the board 1 may be an ordinary resin for injection molding such as vinyl chloride, vinyl acetate or ABS.

Figure 3A:
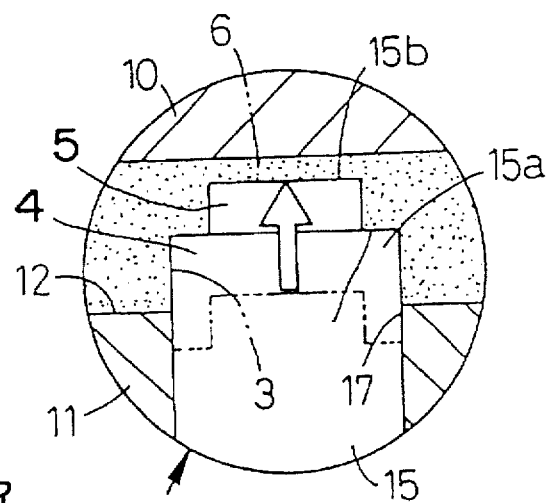
FIGS. 3A and 3B are sectional views of a mold for injection molding.
Figure 3B:
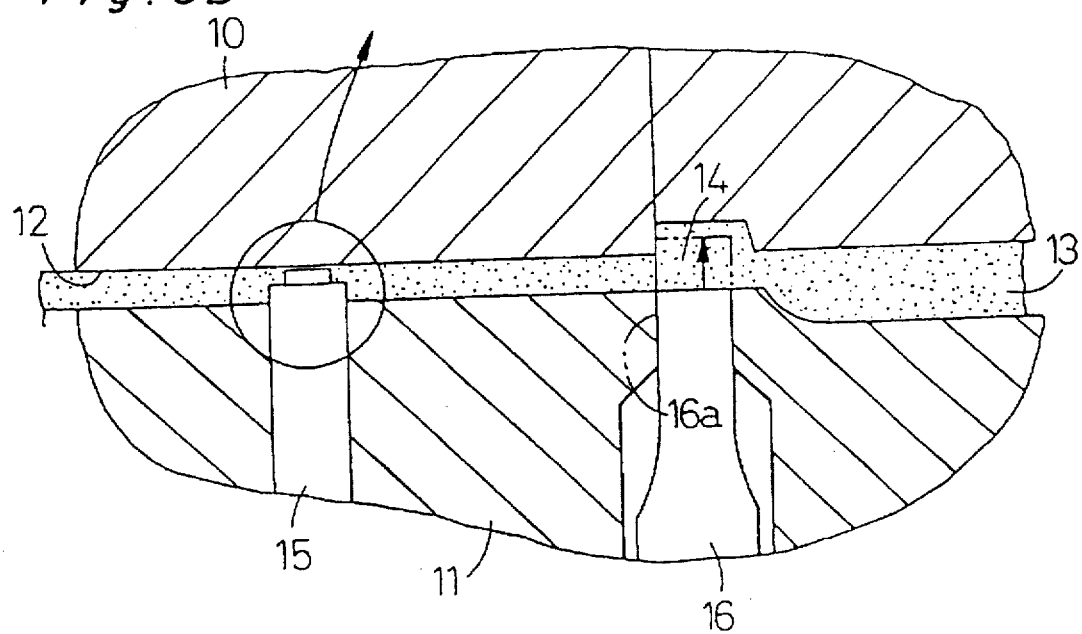

FIGS. 3A and 3B show a mold for injection molding for producing the board 1. The mold is made of a fixed mold 10 and a movable mold 11. A cavity 12 or a space for forming is formed between contact planes of the mold. A spool (not shown) for supplying molten resin under pressure is provided for the fixed mold 10, and a runner 13 connects the spool with each cavity 12 at a narrow gate space 14. Molten resin is injected through the runner 13 and the gate 14. As shown in FIG. 1, the gate space 14 is provided at a longer side of the board near the recess 3 for mounting a component, by avoiding longer and shorter sides S1 and S2 of the IC card.

A slide core 15 is provided at the movable mold 11 for forming the recess 4 of the board 1. The slide core 15 comprises a circular pin, and it has a top forming section 15a having a shape in correspondence to the recess 3 for mounting. The slide core 15 slides perpendicularly to contact planes of a pair of the two molds 10 and 11 to reciprocate between a retracted position where almost all the forming section 15a moves out of the cavity 12 and a forming position where the forming section 15a moves into the cavity 12. When the molds and 11 are dissociated after injection, the slide core 15 moves across the forming position.

Further, a gate pin 16 is provided to connect or disconnect the gate space 14 to each cavity 12. A partition wall 16a is provided at a top portion of the gate pin 16, and it can move to reciprocate between a first position where the cavity 12 is blocked at the gate space 14 and a second position where the partition wall 16a is withdrawn from the gate space 14.

The board 1 is produced with use of the molds 10, 11 explained above according to processes described in FIGS. 4A–4E.

(1) First, the slide core 15 and the gate pin 16 are located at the retracted positions, and the molds 10 and 11 are fixed (FIG. 4A). The top portion 15b of the slide core 15 protrudes a little from an opening of a core hole 17 (FIG. 1) connecting to the cavity 12 (refer to a state shown as a phantom line in FIG. 3A). Thus, a sufficient space can be provided between the top portion 15b and an opposing wall of the cavity 12, so that molten resin can flow with no difficulty to a portion for forming the recess 3.

(2) Next, molten resin is injected through the runner 13 and the gate space 14 into the cavity 12. Because resin flows smoothly into the cavity 12, it is prevented for a flow line around the slide core 15 to be generated in the cavity 12. This means that a strain due to deformation does not happen within the cavity 12. The slide core 15 in the retracted position may project a little into the cavity 12 as long as it does not hinder the flow or the resin. A removed amount of the resin may be large as long as no fin is generated at planes for combining the molds 10 and 11.

After the resin fills the cavity 12, the slide core 15 is moved into the forming position to push aside the resin from an occupied area (FIG. 4B). Because a bottom wall 6 is formed by moving the slide core 15 into the forming position after resin is filled, insufficient injection of resin or defective portions such as weld lines do not occur. In other words, the bottom wall can be formed surely by injection molding. In this step, the board 1 having the bottom wall 6 can be formed surely without increasing injection pressure.

The timing of the movement of the slide core 15 to the forming position may be at any point after the molten resin is injected and until the molten resin solidifies. However, the earliest timing is a time when the molten resin arrives to a portion for forming the film-like resin 6. If the slide core 15 is located to the forming position before the molten resin arrives to a portion for forming the bottom wall 6, it is necessary to fill the molten resin at a higher injection pressure. An appropriate timing is after the molten resin fills the cavity and until the injection pressure is kept constant.

(3) Next, while the injection pressure is kept the same, the gate pin 16 is moved into the gate space 14 to seal the cavity 12 (FIG. 4C). Thus, the gate 14 is cut off from the resin in the cavity 12 during the manufacturing process. The gate space 14 is formed at a periphery adjacent to the recess 3 because molten resin flows surely to portions for forming the recess 3 and the bottom wall 6, especially to prevent defectives due to forming at the bottom wall 6. It is not needed to remove the gate space 14 after separating the molds 10, 11.

(4) Next, in the state described above, the molds 10 and 11 are cooled to solidify the resin filled in the cavity 12. After a prescribed solidification time elapses, the slide core 15 and the gate pin 16 are moved back to the retracted positions thereof (FIG. 4D).

(5) Next, the movable mold 11 is located at a position to be separated from the fixed mold 12, and the molds are opened or the movable mold 10 is removed. In this state, the slide core 15 is moved again into the cavity 12 to separate the board 1 from the movable mold 11 to be taken out from the machine (FIG. 4E). Thus, it can be prevented to form a remain of the knockout pin at a wall of the board 1. The runner 13 is separated from a knockout pin used exclusively for the separation.

By repeating the above-mentioned processes, boards 1 having bottom walls 6 shown in FIGS. 1 and 2 can be mass-produced.

Because the slide core 15 is moved after resin is injected, the board 1 can be formed without a strain due to forming. Therefore, the board 1 has a superior mechanical strength as a whole, and it can also prevent bending due to heat. That is, the board 1 had good endurance.

Figure 5:
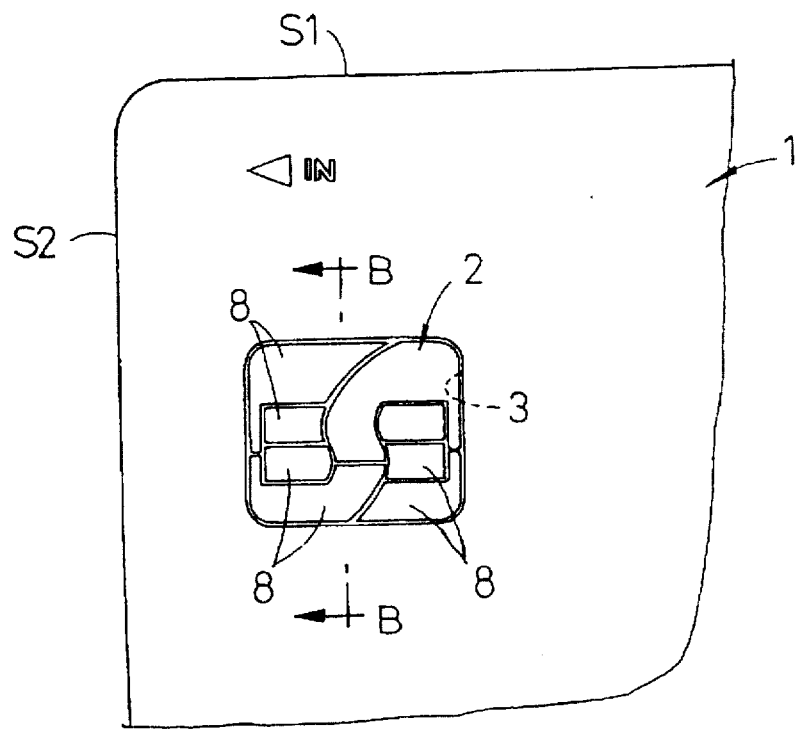
FIG. 5 is a plan view of the board of the plate on which components are mounted.
Figure 6:
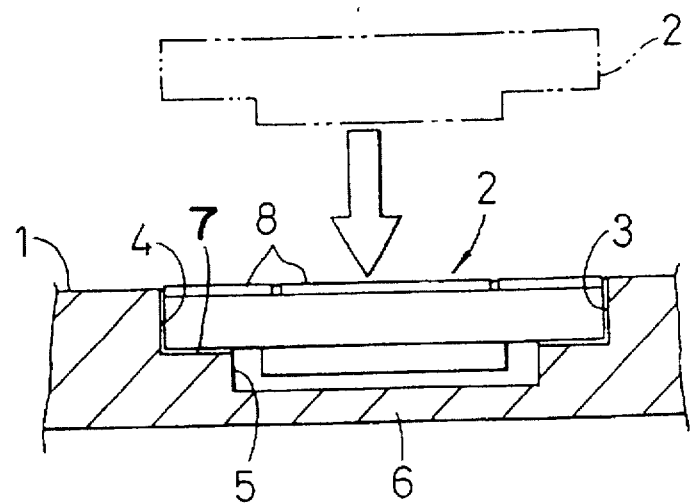
FIG. 6 is a sectional view along B—B line in FIG. 5.

As shown in FIG. 6, a component 2 such as an IC chip is mounted in the recess 3 of the board 1 produced as explained above, with connection terminals 8 thereof exposed above a plane of the board 1. As shown in FIG. 5, the number of the connection terminals 8 is eight in this example.

Figure 7:
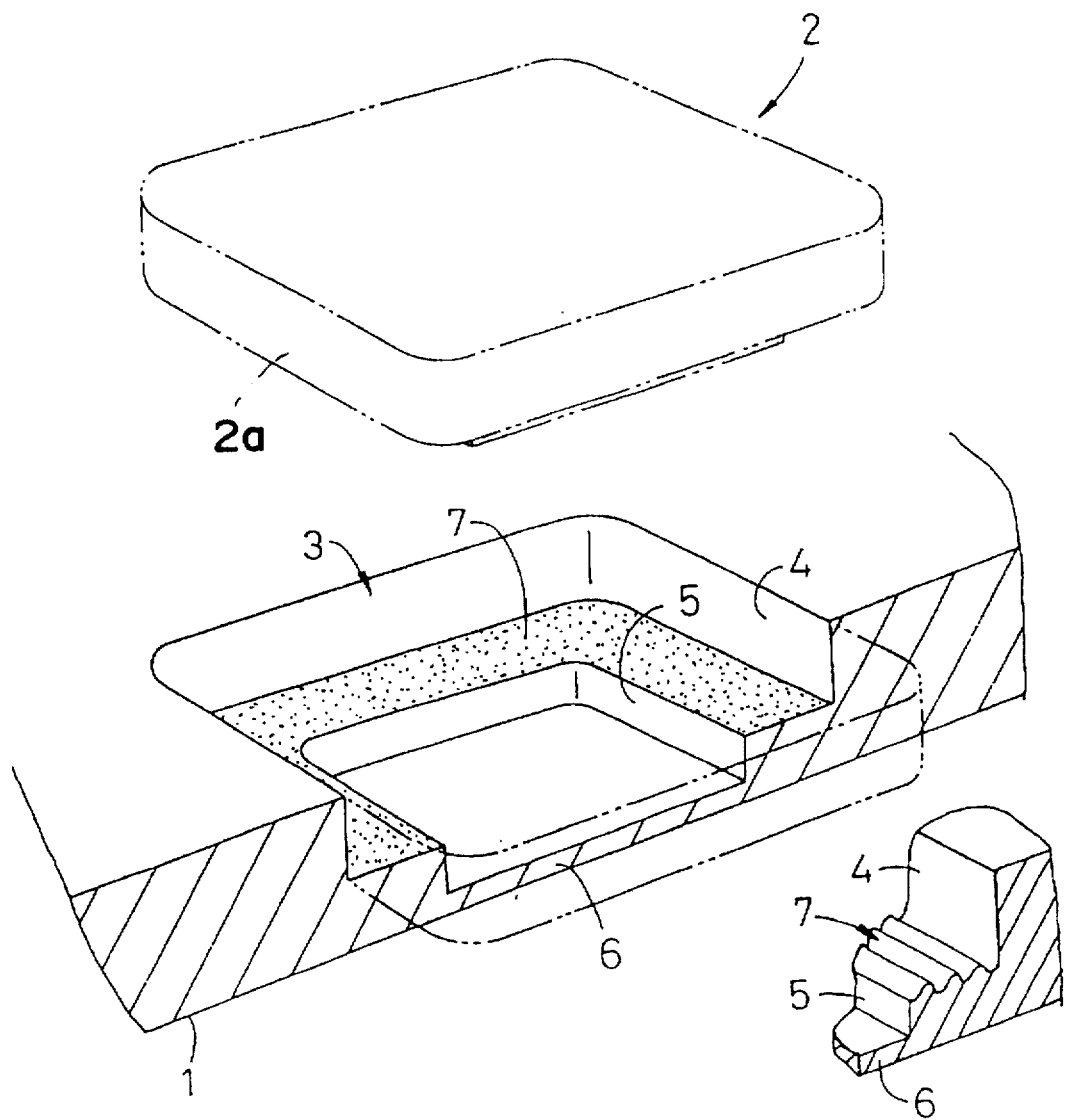
FIG. 7 is a perspective, partially exploded view of the board for illustrating adhesion to the recess.

Next, the component 2 is fixed with an adhesive to an adhesion wall 7 of the first hole 4. The adhesion wall 7 means an area at the bottom of the first hole 4 except the area where the second hole 5 is formed. The adhesive is coated beforehand only on the adhesion wall 7. As shown in FIG. 7, the adhesion wall 7 of the first hole 4 is formed to have an uneven plane such as a rough surface or a plane having a shape of wave, protrusion, saw-teeth or comb in order to fix the component 2 strongly to the recess 3. By coating an appropriate amount of adhesive to the adhesion wall 7, a base 2a of the component 2 is adhered and fixed to the adhesion wall 7. Because the adhesion wall 7 is uneven, adhesion strength increases due to a surface area thereof. Further, the precision of the position along thickness direction of the component 2 does not scatter because the uneven surface for adhesion has generally the same depth. The uneven surface may be formed as the adhesion wall 7 on injection molding.

Then, printing is performed on the front and back planes of the board 1, and a protection film is laminated on the board 1 to complete an IC card. If necessary, as shown in FIG. 1, a magnetic stripe 18 is formed at the back or front side of the board 1 to record magnetic signals.

As shown in FIG. 2 with a phantom line, in the board 1 formed with injection molding, the bottom wall 6 of the recess 3 including the bottom wall 6 tends to expand toward the outside. Measurements of an expansion amount δ show that a maximum thereof is 0.038 mm around the center of the wall 6 and a minimum thereof is 0.007 mm around the peripheral thereof. This means that the expansion amount β is suppressed to a negligible amount by using the above-mentioned manufacturing method which uses the slide core 15 moving into the cavity 12 filled with molten resin to form the bottom wall 6.

Figure 8A:
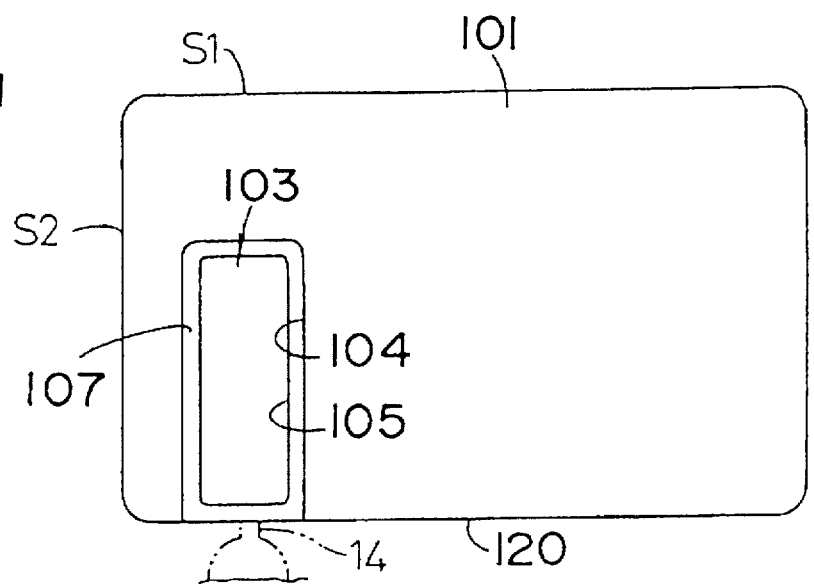
FIGS. 8A, 8B and 8C are plan views of boards having various examples of the recesses for mounting.
Figure 8B:
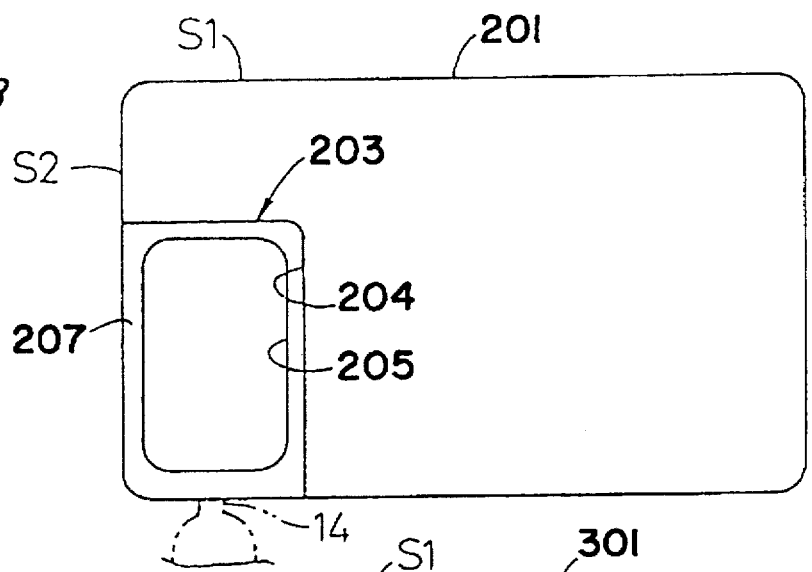
Figure 8C:
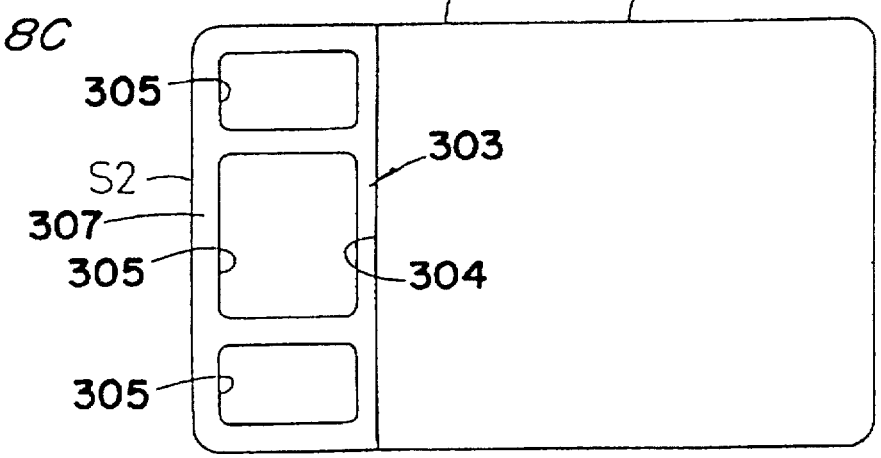

FIGS. 8A–8C show modified examples of the recess for mounting. In FIG. 8A, a recess 103 for mounting a component is extended to a side 120 of a board 101 for an IC card where the gate space 14 is provided, so that a first hole 104 of the recess 103 is open both to the side of the board 101 and to the peripheral. Further, a second hole 105 is formed at the bottom of the first hole 104 leaving an adhesion wall 107. In FIG. 8B, a recess 203 is formed like a terrace so as to occupy one of the four corners of a board 201 for an IC card. Further, a second hole 205 is formed at the bottom of the first hole 204 leaving an adhesion wall 207. In FIG. 8C, a recess 303 is formed to occupy a whole shorter side of a board 301 including side S2, and a first hole 304 is formed at the terrace plane. A plurality of second holes 305 is formed at the bottom of the first hole 304 leaving an adhesion wall 307, in contrast to the second hole 105 and 205 shown in FIGS. 8A and 8B having similar shapes as the first one.

The first and second holes 4, 5 may have any form such as circle, ellipse or triangle beside square. The second hole 5 may have a shape different from that of the first one 4 according to a shape of a component 2 to be mounted. Though the recess 3 comprises the rectangular first and second holes 4, 5 in the above-mentioned embodiments, the recess 3 needs not to have such a structure. For example, the second hole 5 may be omitted and the bottom wall of the first hole 4 is made as a bottom wall 6. Further, the shape of the recesses may be changed to a truncated cone, a truncated pyramid or the like.

The size of the board 1 can be selected in a range of a side along the longitudinal direction from 84.00 to 86.00 mm, a side perpendicular to the longitudinal direction from 53.00 to 55.00 mm and a thickness T1 from 0.05 mm to 0.5 mm. If the thickness T1 is less than 0.05 mm, it becomes harder to form the bottom wall 6 surely even by using the above-mentioned manufacturing method. On the other hand, if the thickness T1 increases above 0.5 mm, the bottom wall 6 can be formed without moving the slide core 15, and the fluidity of the resin is not damaged even if a protrusion wall in correspondence to the slide core 15 is located at the forming position before filling the molten resin.

In the embodiment, it is expected to change the area of the bottom wall 6 in a wide range between 40.00–1,200.00 $mm^2$. This complies with a case where a plurality of IC chips are mounted or components 2 such as a film cell, a display device and/or input/output terminals, in the recesses as shown in FIGS. 8A–8C.

Figure 9:
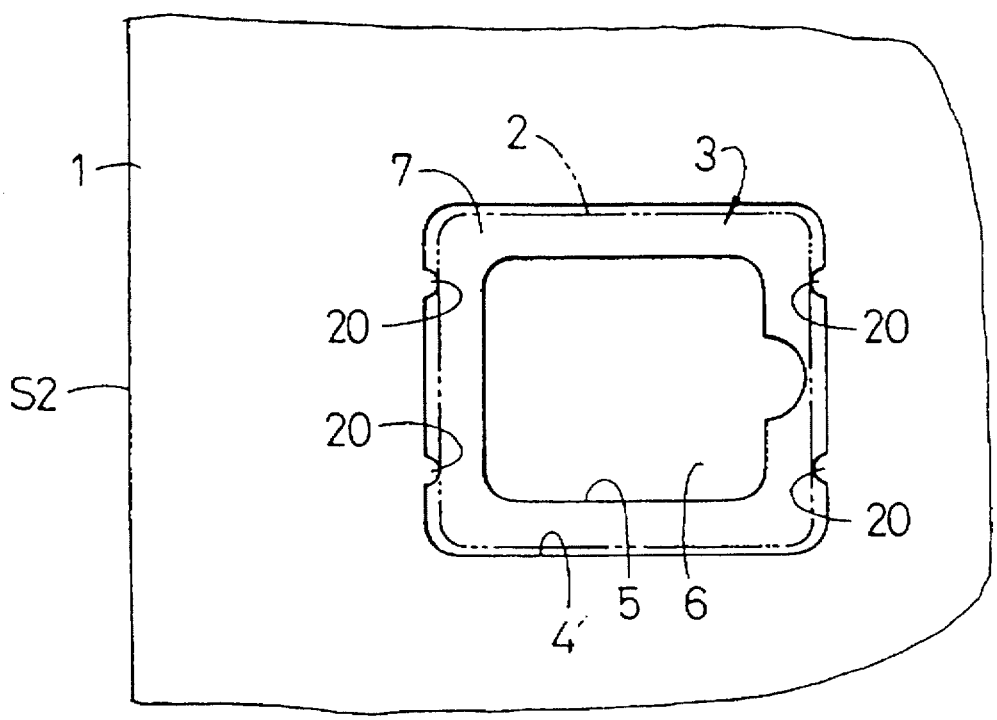
FIG. 9 is a plan view of a board having ribs for fixing components temporarily in recesses.

The board 1 can be modified partly as shown in FIG. 9 where two narrow ribs 20 protrude to the recess 3 at inner walls of a first hole 4' at each shorter side thereof. By using the ribs 20, an IC chip 2 can be mounted or fixed temporarily by pressing it in the first hole 4'. When an IC chip 2 is fixed by the ribs 20 temporarily as explained above so as not to be dropped from the recess 5, it can be prevented for the IC chip 2 to be removed under inertia shock such as vibrations, start or stop of a carrier. The IC chip 2 is fixed by filling an adhesive between an adhesion wall 7 of the first hole 4' and the IC chip 2. The positions and the number of the ribs 20 can be changed so as to be arranged within the recess 3, and the shape and the size thereof can also be adapted according to conditions.

Figure 10:
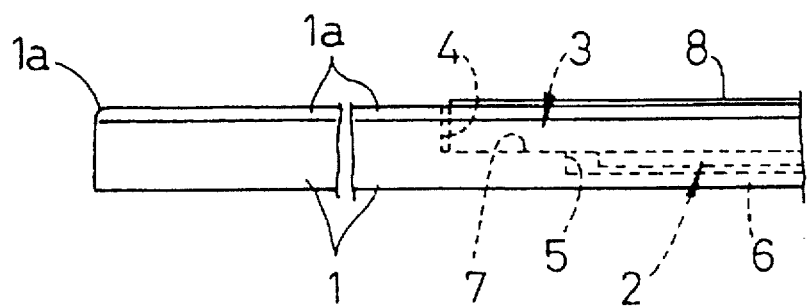
FIG. 10 is a side view of a modified example of the board of the plate.

In a board 1 shown in FIG. 10, the peripheral 1a at the front side has round corners 1a. A mold for injection molding is formed to have partial arcs for the round corners 1a. Because the round corners 1a can be formed on injection molding, it can be produced at a low cost. The board 1 having round corners is hard to be caught when inserted to or removed from a card reader, or malfunctions such as errors on loading or injection occur hardly. The round corners 1a can also be flat small slant planes formed at edges of the board. It may also be formed only at a pair of longer or shorter sides among the four sides.

Figure 11A:
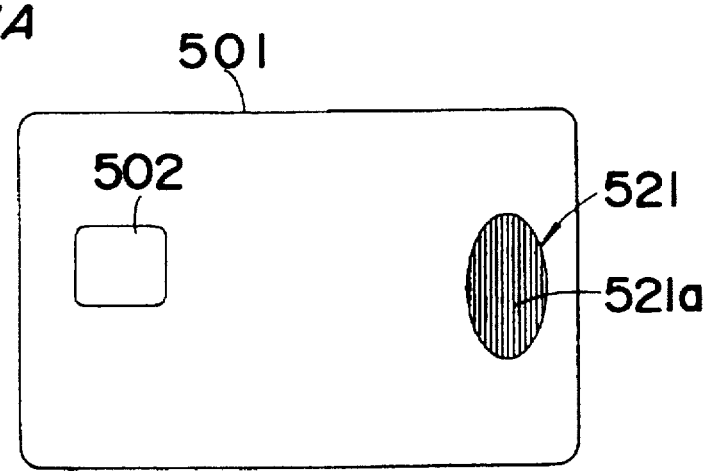
FIGS. 11A, 11B and 11C are plan views of various examples of the board of the plate.
Figure 11B:
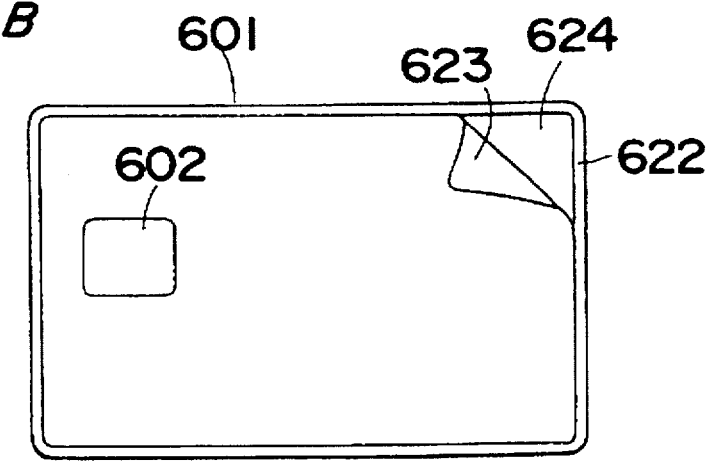
Figure 11C:
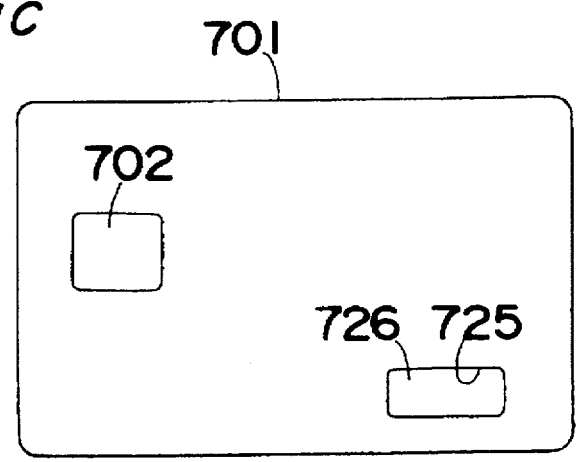

As explained above, injection molding is used to manufacture the board for an IC card. Therefore, various structures can be added at the outer planes of the board. For example, in a structure shown in FIG. 11A, a knob 521 is provided at one of the surfaces of the board 501, and a safeguard 521a having continuous grooves and ridges for preventing sliding can be formed as an integral body with a main body of the board 501. In a structure shown in FIG. 11B, a frame 622 is formed along the peripheral of a board 601 for an IC card, and a wall plane surrounded by the frame 622 is depressed as an adhesion plane 624 for adhering a protection film 623. In a structure shown in FIG. 11C, a plane wall of the board 701 has a depressed portion 725 for embedding a mark 726 of a company, an emblem for displaying a grade of the card or the like. Though not shown in detail, in these examples, a component 502, 602, 702 such as an IC chip is fixed to a recess 503, 603, 703 (not shown) having a structure similar to the above-mentioned recesses.

Figure 12:
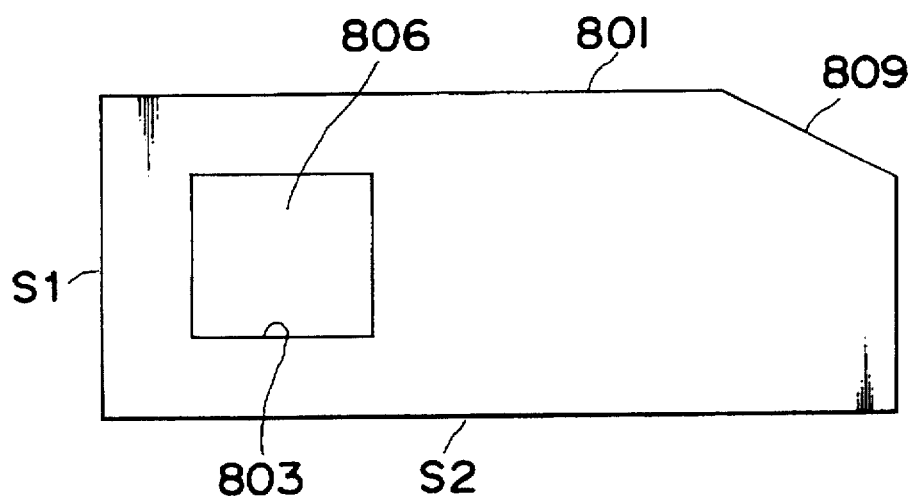
FIG. 12 is a plan view of another embodiment of the board of the plate.

The board for an IC card is not needed to be a square. For example, FIG. 12 shows a board 801 having a shape of a telephone card. The board 801 has a slant side 809 besides shorter and longer S1 and S2. In this example, the board 801 has a size of a longer side of 80.00–15.00 mm, a shorter side of 50.00–10.00 mm and a thickness T of 0.5–0.9 mm. A ratio of a thickness T1 of a bottom wall 806 of a recess 803 to an area of the board 801 is set to be from $1/(8.5*10^4)$–$1/(3.0*10^2)$.

Figure 13:
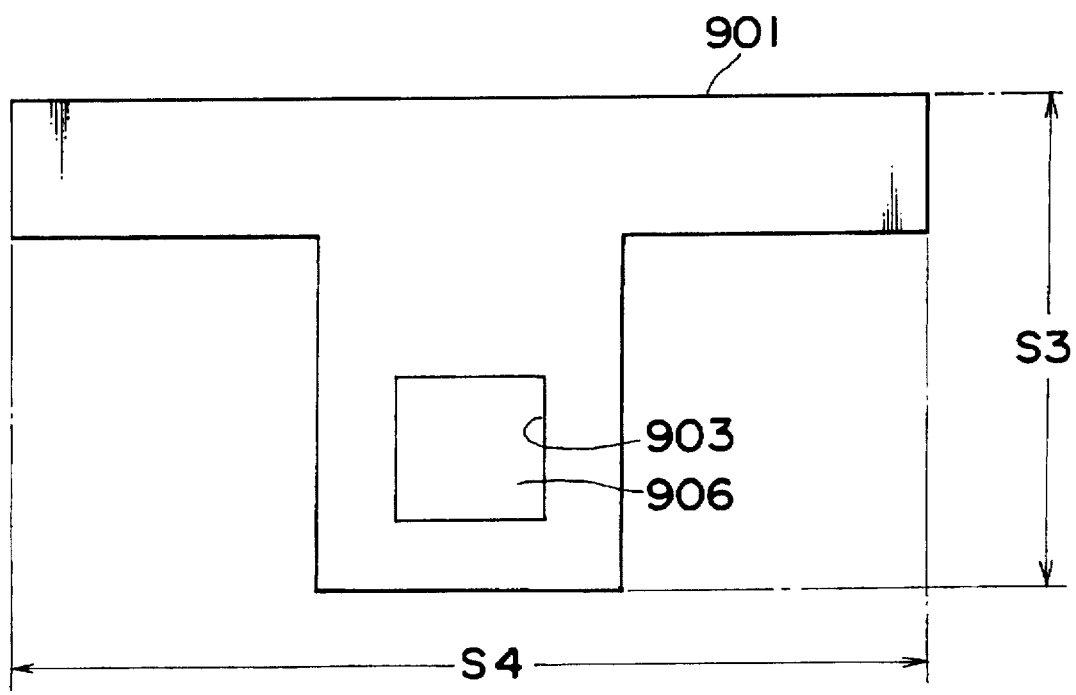
FIG. 13 is a plan view of a different embodiment of the board of the plate.

The recess 3 for mounting a component does not necessarily have a terrace structure. The second hole 5 may be omitted as shown in FIG. 13. In this case, a hole having a bottom wall is formed, and a part of the inner surface of the hole is used for adhesion of a component. For example, the recess 3 may be formed as an upside-down truncated pyramid or cone, and the slopes at the side of the opening is formed as an uneven surface as an adhesion wall 7. The inner wall of the recess 4 may be formed as a continuous ridge plane, to be used as an adhesion plane 7. The uneven plane of the adhesion wall 7 may also be formed as grooves and ridges arranged as a lattice, parallel grooves or ridges, or independent pits or projections.

The board for IC card shown in FIG. 13 has a shape of character T for use as a key for locking a door. The board 901 has a length S3 along a shorter side of 30–60 mm and a length S4 along a longer side of 30–60 mm. A recess 903 having a bottom wall 906 is provided near an end of the shorter side.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for manufacturing a board for an IC card, wherein the board comprises a main body having a shape of a plate, and a recess having a space for receiving and adhering a component, the recess being formed in one of the planes of the main body, the recess comprising a bottom wall integrated as one body with the main body, the method comprising the steps of:

providing a pair of molds combined for injection molding, the molds forming a cavity between them for forming the board, one of the molds comprising a slide core facing the cavity so as to be able to protrude into the cavity, the slide core comprising a top portion having a contour of the recess with the bottom wall;

injecting molten resin into the cavity;

moving the slide core into the cavity to a prescribed position after the molten resin is injected and before a constant pressure is applied to the molten resin until the resin begins to solidify;

moving back the slide core to a retracted position after the resin in the cavity solidifies;

opening the molds; and moving the slide core into the cavity to separate the solidified board.

2. The method according to claim 1, wherein the thickness of the bottom wall is in a range from 0.05–0.5 mm.

3. The method according to claim 1, wherein said molds further form a gate space connected to the cavity and one of said molds comprises a gate pin facing the gate space so as to be able to protrude into the gate space for blocking the cavity from the gate space, the method further comprising the step of:

projecting the gate pin into the gate space to seal the cavity and to cut off resin in the gate section after injection of the molten resin into the cavity is complete.

4. The method according to claim 3, wherein the board has a rectangular plate having longer and shorter sides, and the gate space is provided at one of the longer and shorter sides.

5. The method according to claim 1, wherein the board has a shape of a rectangular plate having longer and shorter sides, a part of the longer and shorter sides being used as reference edges, and a gate is provided at one of the longer and shorter sides.

6. The method according to claim 1, wherein the top portion of said slide core having a contour of the recess comprises a first part having a plane facing the cavity and a second part connected to the plane of the first part, the second part having a sectional area more narrow than the first one.

7. The method according to claim 6, wherein said slide core has an uneven surface in the plane connecting the second part.

8. The method according to claim 1, wherein said main body has a shape of a rectangular plate of a longer side of 84.00–86.00 mm, a shorter side of 53.00–55.00 mm and a thickness of 0.5–0.9 mm, and a ratio of a thickness of the bottom wall of the recess to an area of the board is in a range of $1/(9.5*10^4)$ to $1/(8.90*10^3)$.

9. The method according to claim 1, wherein a ratio of an area of the bottom wall to an area of the board is in a range of 0.8 to 27%.

10. The method according to claim 8, wherein a ratio of an area of the bottom wall to an area of the board is in a range of 0.8 to 27%.

11. The method according to claim 1, wherein said main body has a longer side of 15.00–80.00 mm, a shorter side of 10.00–50.00 mm, and a thickness of 0.5–0.9 mm, and a ratio of a thickness of the bottom wall of the recess to an area of the board is in a range of $1/(8.5*10^4)$ to $1/(3.0*10^3)$.

12. The method according to claim 11, wherein a ratio of an area of the bottom wall to an area of the board is in a range of 4 to 8%.

13. The method according to claim 1, wherein a ratio of an area of the bottom wall to an area of the board is in a range of 4 to 8%.

14. A method for manufacturing a board for an IC card, wherein the board comprises a main body having a shape of a plate, and a recess having a space for receiving and adhering a component, the recess being formed in one of the planes of the main body, the recess comprising a bottom wall integrated as one body with the main body, the method comprising the steps of:

provide a pair of molds combined for injection molding, the molds forming a cavity between them for forming the board, said molds further forming a gate space connected to the cavity, one of the molds comprising a slide core facing the cavity and movable along a first longitudinal axis so as to be able to protrude into the cavity, the slide core comprising a top portion having a contour of the recess with the bottom wall, one of said molds comprising a gate pin facing the gate space and movable along a second longitudinal axis parallel to said first longitudinal axis;

injecting molten resin into the cavity;

moving the slide core along said first longitudinal axis and into the cavity to a prescribed position before the resin solidifies; then projecting the gate pin along said second longitudinal axis and into the gate space to seal the cavity and to cut off resin in the gate space after injection of the molten resin into the cavity is complete;

moving back the slide core to a retracted position after the resin in the cavity solidifies;

opening the molds; and moving the slide core into the cavity to separate the solidified board.

15. The method for manufacturing a board for an IC card according to claims 14, wherein the thickness of the bottom wall is in a range from 0.05–0.5 mm.

16. The method for manufacturing a board for an IC card according to claim 14, wherein the board has a shape of a rectangular plate having longer and shorter sides, and the gate space is provided at one of the longer and shorter sides.

17. The method for manufacturing a board for an IC card according to claim 14, wherein the top portion of said slide core having a contour of the recess comprises a first part having a plane facing the cavity and a second part connected to the plane for the first part, the second part having a sectional area more narrow than the first one.

18. The method for manufacturing a board for an IC card according to claim 14, wherein a ratio of an area of the bottom wall to an area of the board is in a range of 0.8 to 27%.

19. The method for manufacturing a board for an IC card according to claim 14, wherein said main body has a longer side of 15.00–80.00 mm, a shorter side of 10.00–50.00 mm, and a thickness of 0.5–0.9 mm, and a ratio of a thickness of the bottom wall of the recess to an area of the board is in a range of $1/(8.5*10^4)$ to $1/(3.0*10^3)$.

* * * * *